United States Patent [19]

Hose, Jr. et al.

[11] Patent Number: 5,555,529

[45] Date of Patent: Sep. 10, 1996

[54] POWER SAVING ARCHITECTURE FOR A CACHE MEMORY

[75] Inventors: R. Kenneth Hose, Jr., Aloha; David P. DiMarco, Hillsborough, both of Oreg.

[73] Assignee: Intel Corporation, Santa Clara, Calif.

[21] Appl. No.: 542,514

[22] Filed: Oct. 13, 1995

Related U.S. Application Data

[63] Continuation of Ser. No. 174,382, Dec. 28, 1993, abandoned.

[51] Int. Cl.$^6$ ............................ G11C 7/00; G11C 8/00
[52] U.S. Cl. .............. 365/230.06; 365/49; 365/230.03; 365/230.04
[58] Field of Search ................... 365/49, 230.04, 365/230.06, 230.03

[56] References Cited

U.S. PATENT DOCUMENTS

| | | | |
|---|---|---|---|
| 4,849,937 | 7/1989 | Yoshimoto | 365/230.04 X |
| 4,982,372 | 1/1991 | Matsuo | 365/230.04 X |
| 5,016,216 | 5/1991 | Ali | 365/230.04 X |
| 5,121,354 | 6/1992 | Maudalia | 365/230.04 X |
| 5,121,360 | 6/1992 | West et al. | 365/230.04 X |

OTHER PUBLICATIONS

"The Metaflow Architecture", © 1991 IEEE, Jun. IEEE Micro, Authors: Val Popescu, Merle Schultz, John Spracklen, Gary Gibson, Bruce Lightner, David Isaman.

*Primary Examiner*—Do Hyun Yoo
*Attorney, Agent, or Firm*—Blakely, Sokoloff, Taylor & Zafman

[57] ABSTRACT

An improved cache memory architecture is disclosed, having particular application in a cache having static random access memory (RAM). In a typical static RAM memory utilized as a cache, the cache has the requirement that it must access many more bits than is required for selection. A single wordline of the RAM may span an entire memory array, and the activation of the entire wordline results in many more bitlines activated than will actually be selected by the Y decoder. As a result, power is wasted. The present invention provides a cache memory in which even and odd columns are segregated, wherein the even addressed columns may be placed in a first set (0) and the odd addressed columns in a second set (1). The wordline decode includes two wordlines per row rather than the typical single wordline in prior art systems. The first wordline corresponds to the "even" wordline, and the second wordline corresponds to the "odd" wordline (set 1). Only one wordline is activated at any time to save power. The wordline decoder of the present invention utilizes an address bit (for example, the low order bit) to select either the driver for the columns corresponding to the even wordline or to the odd wordline. Although the present invention requires additional drivers, only one driver is activated at any one time. It has been found that the architecture of the present invention provides a total power savings in a read operation approaching fifty percent.

10 Claims, 3 Drawing Sheets

5,555,529

POWER SAVING ARCHITECTURE FOR A CACHE MEMORY

This is a continuation of application Ser. No. 08/174,382, filed Dec. 28, 1993, now abandoned.

BACKGROUND OF THE INVENTION

1. Field of the Invention

The present invention relates to memory architectures, and more particularly, the present invention relates to memory architectures for cache memories to reduce the average current required for read or write operations.

2. Art Background

In many data processing systems, it is common to utilize a high speed buffer memory, referred to as a "cache", coupled to a central processing unit (CPU) to improve the average memory access time for the processor. The use of the cache is based upon the premise that over time, a data processing system will access certain localized areas of memory with high frequency. The cache typically contains a subset of the complete data set disposed in the main memory, and can be accessed very quickly by the CPU without the necessity of reading the data locations in the main memory.

The use of a cache adds considerable complexity to a data processing system and substantially increases system cost and power requirements. In modern computer systems, it is critical to minimize power requirements whenever possible. The minimization of power requirements increases system efficiency, and, in the case of portable computer systems, prolongs battery life.

As will be described, the present invention provides a memory architecture, having particular application to cache memories, which reduces the average current for a read operation significantly. The present invention discloses apparatus and methods for providing an improved cache memory architecture in a computer system.

SUMMARY OF THE INVENTION

An improved cache memory architecture is disclosed, having particular application in a cache comprising static random access memory (RAM). In a typical static RAM memory utilized as a cache, the cache has the requirement that it must access many more bits than will be selected for a read or write operation. A single wordline of the RAM may span an entire memory array, and the activation of the wordline results in many more bitlines activated than will actually be selected by the Y decoder at the output. As a result, power is wasted. The present invention provides a cache memory in which even and odd columns are segregated, wherein the even addressed columns may be placed in a first set (0) and the odd addressed columns in a second set (1). The wordline decode includes two wordlines per row rather than the typical single wordline in prior art systems. The first wordline corresponds to the "even" wordline, and the second wordline corresponds to the "odd" wordline. Only one wordline is activated at any time to save power. The wordline decoder of the present invention utilizes an address bit (for example, the low order bit) to select either the driver for the columns corresponding to the even wordline or to the odd wordline. Although the present invention requires additional drivers, only one driver is activated at any one time.

DETAILED DESCRIPTION OF THE INVENTION

An improved memory architecture is disclosed, having particular application for use in static RAM memories. In the following description for purposes of explanation, specific memory architectures, data lines, wordlines, columns, architectures and components are set forth in order to provide a thorough understanding of the present invention. However, it will be apparent to one skilled in the art that the present invention may be practiced without theses specific details. In other instances, well known circuits are shown in block diagram form in order not to obscure the present invention unnecessarily.

Figure 1:
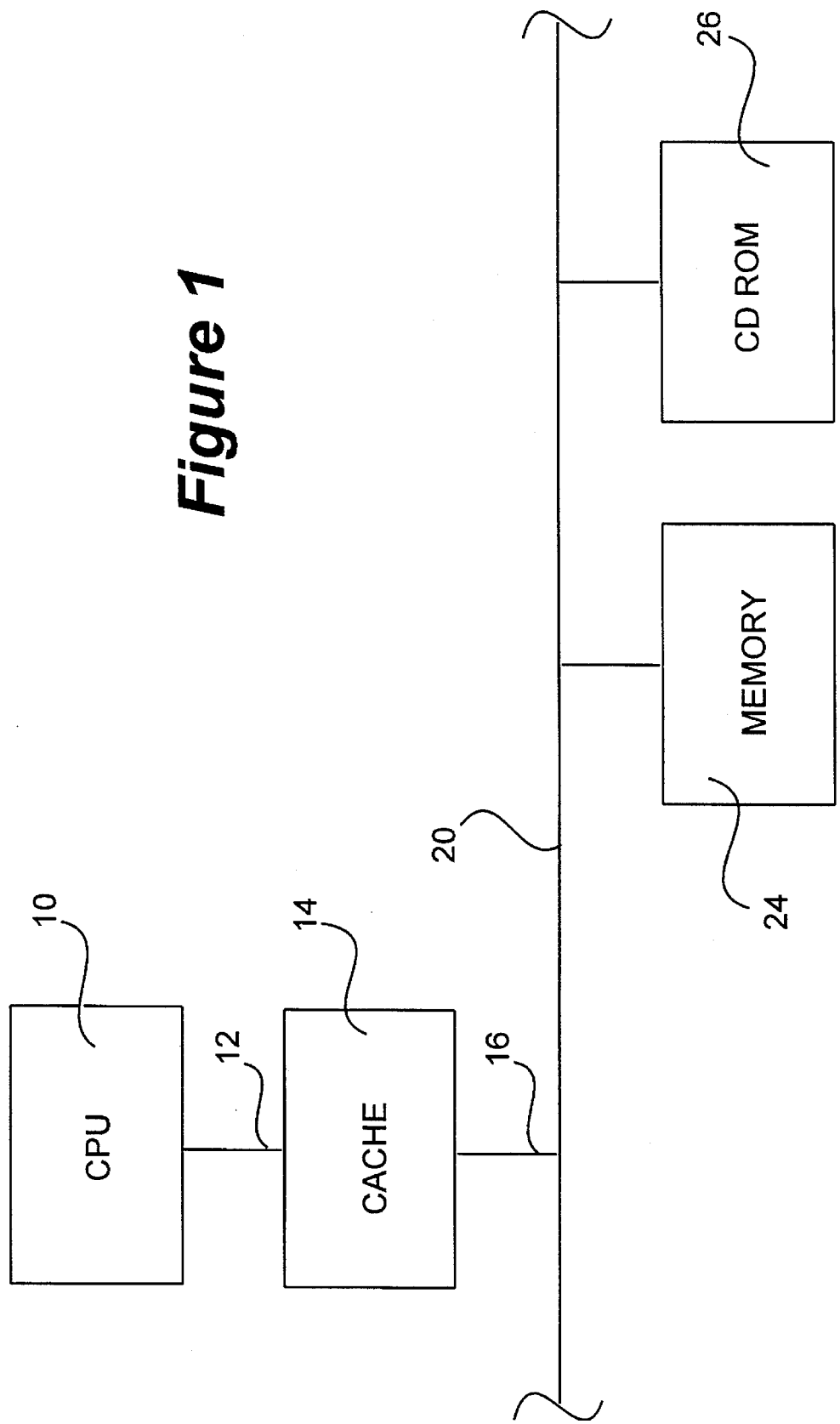
FIG. 1 illustrates one possible computer system employing the teachings of the present invention.

With reference to FIG. 1, one possible computer system employing the teachings of the present invention is shown. As illustrated, a central processing unit (CPU) 10 is coupled over line 12 to a cache memory 14. As shown, the cache memory 14 is coupled over line 16 to a bus 20. A main memory 24 is also shown coupled to the bus 20, as is a CD read only memory (ROM) 26. In executing programs or accessing data, the CPU 10 issues a memory read command directed at memory 24, or the CD ROM 26. As practiced in the art, the cache 14 includes a subset of commands and/or data disposed within the memory 24 and/or the CD ROM 26. By retaining a subset of frequently accessed data and/or commands within the cache 14, the efficiency of the CPU is enhanced since access to the cache 14 may be accomplished faster than a corresponding access to the respective memory devices 24 and 26 over the bus 20. It will be appreciated by one skilled in the art, that the teachings of the present invention are applicable to a variety of computer systems and architectures, and that the system illustrated in FIG. 1 is merely a representative system which may employ the invention as taught herein.

Figure 2:
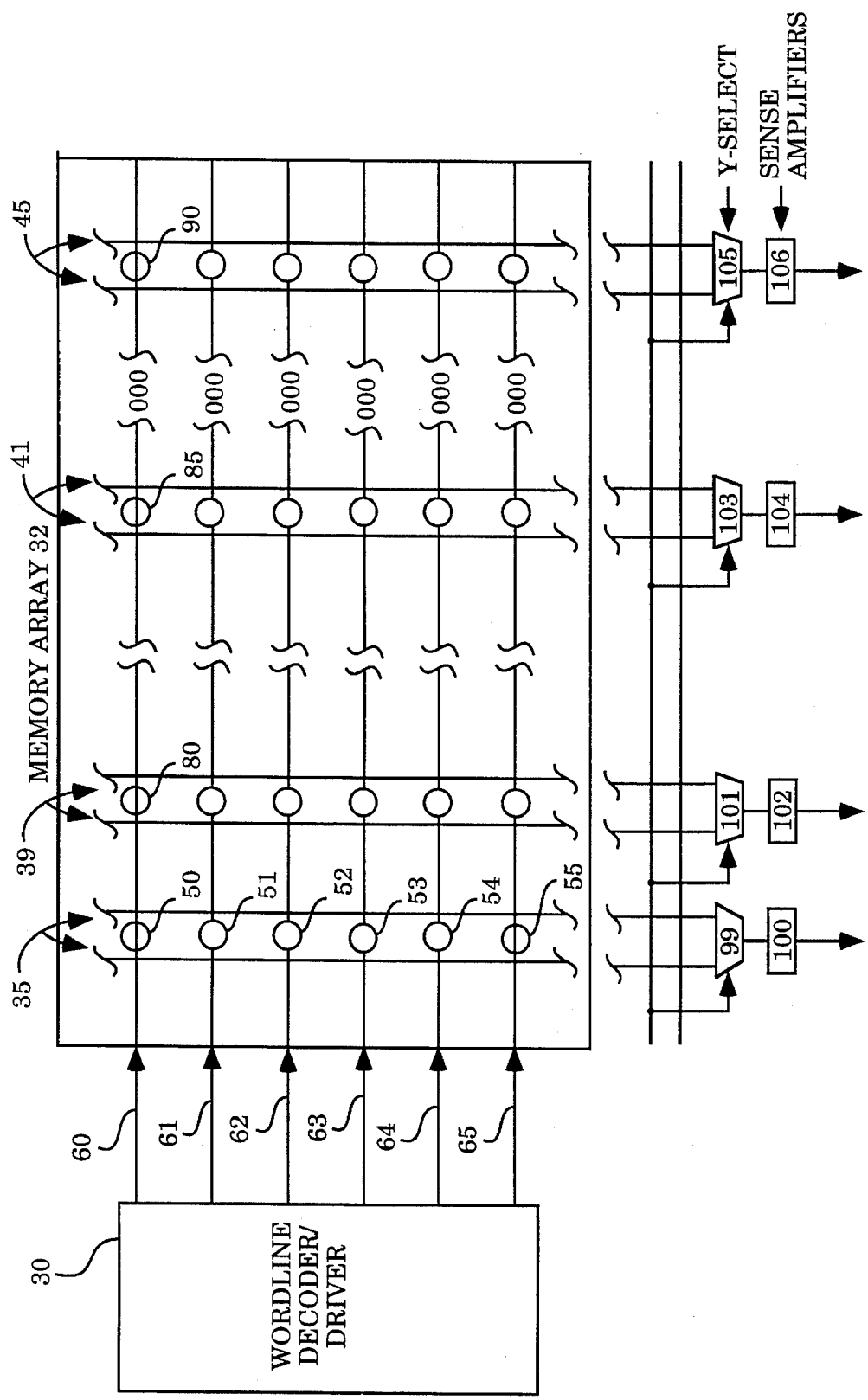
FIG. 2 illustrates a prior art cache architecture.

Referring now to FIG. 2, therein is shown a prior art cache memory architecture which includes a wordline decoder/driver 30 and a memory array 32. The memory array 32 includes a plurality of bitline pairs, for example bitlines 35, 39, 41, and 45. As is well know, a plurality of memory cells 50, 51, 52, 53, 54, and 55 are disposed between each pair of bitline pairs (for example, bitlines 35). As illustrated in FIG. 2, each memory cell 50–55 disposed between the bitlines corresponds to one memory column in the memory array 32. Each wordline 60, 61, 62, 63, 64, and 65 spans the entire memory array 32. The intersection of the wordlines along each row with the bitlines determines which memory cell located at the intersection of the wordline and the bitlines that is read from, or written into, the memory array 32. As is known in the art, each bitline pair (for example bitline pair 35) includes a bitline along with a bitline compliment. Moreover, as illustrated in FIG. 2, the memory array 32 includes a plurality of bitlines and wordlines, which have been depicted in FIG. 2 in a simplified fashion in order to clearly identify the present invention, as will be described in the Specification. It will be appreciated that actual memory caches, main memories, and other memory arrays include many more wordlines and bitlines than are depicted in the figures illustrated herein.

Continuing to refer to FIG. 2, in operation, an X address is provided to the wordline decoder/driver 30. The X address is decoded by the wordline decoder/driver 30 and one of the wordlines (60–65 in the present example) is selected. Assume for sake of example, that an X address is provided to the wordline decoder/driver 30 and that wordline 60 is selected. The selection of wordline 60 activates all memory cells disposed along the selected wordline. In the present example, the selection of wordline 60 results in the activation of memory cell 50, 80, 85, and 90. The activation of wordline 60 results in the binary value of each memory cell disposed along the activated wordline (either a binary 0 or binary 1) being provided for each pair of bitlines (columns) within the memory array 32. The output for each pair of bitlines (columns) is coupled to a sense amplifier. As shown in FIG. 2, bitlines 35 provide an output bit value through a Y select multiplexor 99 to a sense amplifier 100, bitlines 39 provide an output through a Y select multiplexor 101 to a sense amplifier 102, bitlines 41 provide an output through a Y select multiplexor 103 to a sense amplifier 104, and bitlines 45 provide an output through a Y select multiplexor 105 to a sense amplifier 106. However, it is common in data processing systems that in virtually all cases the output for each column within the memory array is not required. In a common 2:1 decode system, only the data from every other set of bitlines (columns) is utilized. In other systems, perhaps only 1 out of 4, 1 out of 8, or 1 out of 16 columns are utilized by the system. Thus, it is common in prior art systems to address many more columns than the system will actually select through the application of the Y address. However, the activation of each column disposed along a wordline is not energy efficient. As is well known, the selection of the bitlines comprising the columns result in the memory cell discharging the bitlines. Each of the bitlines have associated with it a parasitic capacitance. At the end of each memory cycle, the bitlines which have been discharged must be restored to their original charged state, thus requiring the use of system power (Vcc). It is desirable to avoid the discharge of the bitlines if it is not necessary to read the data from the discharged line. The average current to charge the bitline pair can be described by the following expression:

$$I_{ave} = \frac{C(\text{bitline}) \times \Delta V}{\Delta t}$$

where I equals average current to charge a bitline pair, C equals capacitance of the bitline, V equals voltage swing on the bitlines and t equals time between successive charge-up cycles (precharge);

where Power $(P) = I_{ave} \times V$;

and wherein $I_{ave}$ equals average current to charge a bitline pair.

It will be appreciated that in a 2:1 multiplexor, up to 50% of the value of I(ave) will be wasted by discharging bitlines in which the data is not utilized.

Figure 3:
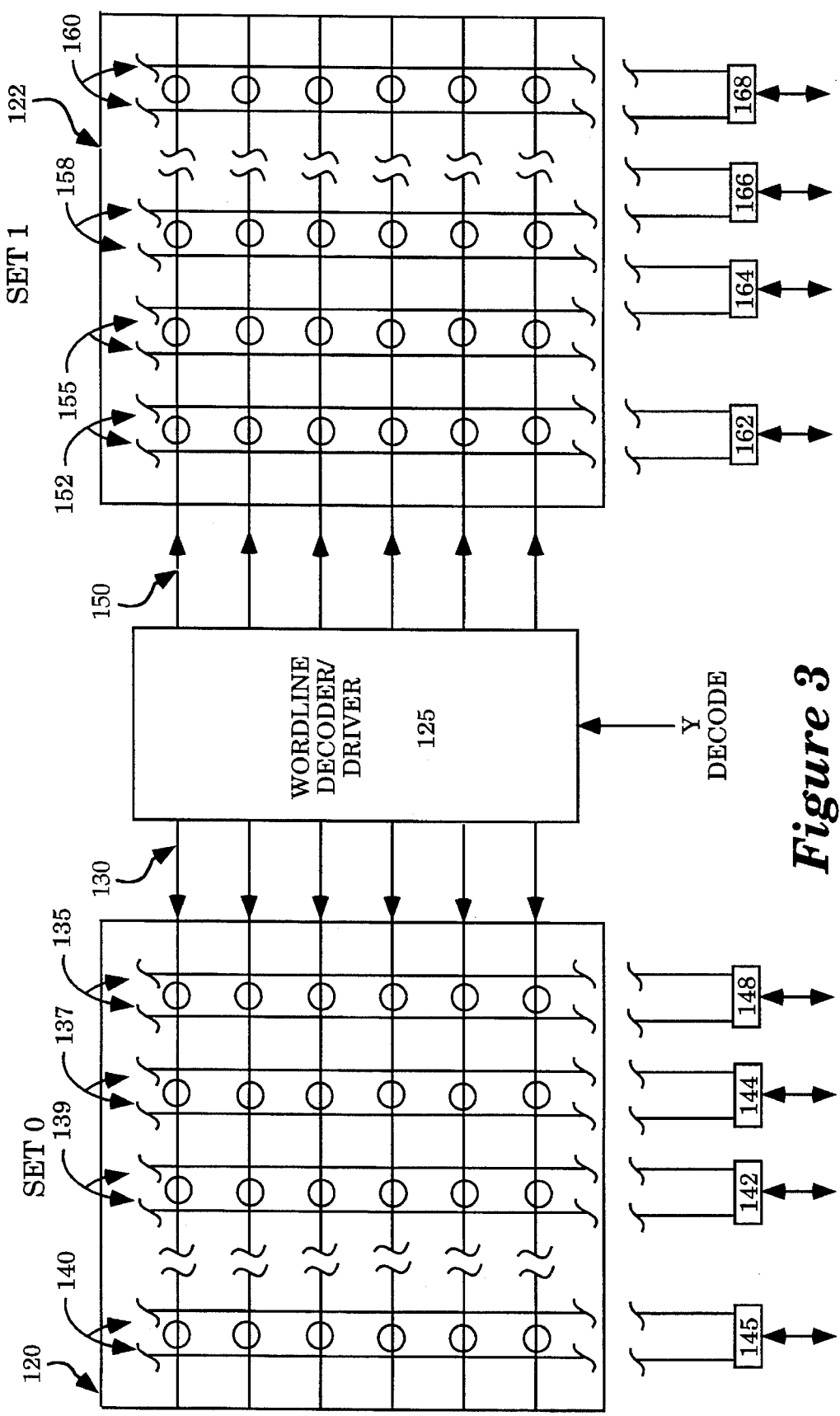
FIG. 3 illustrates cache architecture of the present invention to segregate the even addressed columns and odd addressed columns into set 0, and set 1, respectively.

Referring now to FIG. 3, the present invention modifies the architecture of the memory array illustrated in FIG. 2, by providing a first array 120 identified as "set 0", and a second array 122 referred to in FIG. 3 as "set 1". The present invention separates the columns into even and odd columns wherein the columns disposed within the memory array 120 (set 0) comprise odd columns, and the columns disposed in array 122 (set 1) comprise even columns.

As shown in FIG. 3, in the case of a 2:1 decode, either the bitlines disposed within set 0 or the bitlines disposed within set 1 will be discharged, but not both. In other words, in accordance with the teachings of the present invention, the activation of a wordline, such as wordline 130, results in the discharge of bitlines 135, 137, 139, and 140. The value of the memory cell (either a "0" or a "1") defined by the intersection of wordline 130 with the various pairs of bitlines comprising the columns, is coupled to sense amplifiers 142, 144, 145, and 148, as illustrated in FIG. 3. Since none of the bitlines disposed within array 122 (set 1) were discharged, there is a net power savings using the teachings of the present invention. The power savings results because only half of the bitlines are discharged, unlike the prior art memory array 32 of FIG. 2. It will be appreciated, that the memory architecture illustrated in FIG. 2 provides optimal performance using a 2:1 decode. Assume for sake of example that wordline 150 in FIG. 3 is activated thereby discharging each bitline pair (column) within array 122 (set 1). Accordingly, bitlines 152, 155, 158, through to bitline 160 are discharged. Each memory cell disposed at the intersection of the various bitlines and wordline 150 thereby provides either a 0 or a 1 to the respective sense amplifiers 162, 164, 166, and 168. However, since the elected columns comprise even columns in the present example, none of the columns 135, 137, 139 or 140 disposed in set 0 are discharged. It will therefore be appreciated that the present invention reduces the average current for a read cycle by up to 50%. This is a result of requiring half as many columns to be precharged after a read operation, and by having half as many memory cells conducting DC current. Additionally, as illustrated in FIG. 3, the necessity of using a 2:1 multiplexor is eliminated using the architecture of the present invention.

It will further be noted that the present invention's power saving architecture may be extended to additional memory arrays to accommodate various additional multiplexing, for example 4:1, 8:1, 16:1, etc. Moreover, it is anticipated that the wordline decoder 125 may utilize an address bit (for example, the low order bit) to select either the driver or the columns in set 0 or the columns in set 1. However, it is anticipated that a variety of mechanisms may be utilized to select the driver for columns within the memory array 120 or columns in memory array 122.

While the present invention has been described in conjunction with FIGS. 1–3, it will be apparent to those skilled in the art that many alternatives, modifications, and variations in light of the foregoing description are possible. Accordingly, the invention is intended to embrace all such alternatives, modifications and variations as may fall within the spirit and scope of the invention as disclosed.

We claim:

1. A computer system including a central processing unit (CPU) coupled to a memory, said memory comprising:

a first memory array having a plurality of memory cells for storing digital data, each of said memory cells disposed at the intersection of a first plurality of bit line columns and a first plurality of wordlines;

a second memory array having a plurality of memory cells for storing digital data, each of said memory cells disposed at the intersection of a second plurality of bit line columns and a second plurality of wordlines, the first and second plurality of wordlines having a corresponding relationship to each other;

a single wordline address decoder/driver assembly centrally disposed in between said first and second memory arrays and exclusively coupled to each of said first and second plurality of wordlines for receiving an address signal from said CPU, said single wordline address decoder/driver assembly including means for selecting exclusively either said first or said second array, and electrically activating one of said wordlines in said selected array in accordance with said address signal without electrically activating the corresponding wordline of the unselected array, such that each bit line column intersected by said electrically activated wordline in said selected array electrically discharges to provide the value of the memory cell at the point of intersection with the electrically activated wordline as an output to said CPU, while each bit line column intersected by the unactivated corresponding wordline in the unselected array does not electrically discharge to provide the value of the memory cell at the point of intersection with the unactivated wordline to said CPU, thereby reduces power consumption of the memory;

said CPU receiving said provided values of said memory cells disposed along said activated wordline.

2. The system as defined by claim 1 further including a sense amplifier coupled to each of said bit line columns intersected by said electrically activated wordline for receiving one of said outputs, said sense amplifiers amplifying said outputs and coupling said outputs to said CPU.

3. The system as defined by claim 2 wherein said memory comprises a cache memory.

4. The system as defined by claim 3 wherein said means selects said first or second array using a predefined bit in said address signal.

5. A cache memory, comprising:

a first memory array having a plurality of memory cells for storing digital data, each of said memory cells disposed at the intersection of a first plurality of bit line columns and a first plurality of wordlines;

a second memory array having a plurality of memory cells for storing digital data, each of said memory cells disposed at the intersection of a second plurality of bit line columns and a second plurality of wordlines, the first and second plurality of wordlines having a corresponding relationship to each other;

a single wordline address decoder/driver assembly centrally disposed in between said first and second memory arrays and exclusively coupled to each of said first and second plurality of wordlines for receiving a digital address signal from a central processing unit (CPU), said single wordline address decoder/driver assembly using at least one predefined bit of said address signal to select exclusively either said first or said second memory array, and using said address signal to electrically activate one of said wordlines in said selected array without electrically activating the corresponding wordline in the unselected array, such that each bit line column intersected by said electrically activated wordline in said selected array electrically discharges to provide a digital output to said CPU, while each bit line column intersected by the unactivated corresponding wordline in the unselected array does not electrically discharge to provide a digital output to said CPU, thereby reduces power consumption by the cache memory.

6. The cache memory as defined by claim 5 wherein said first array comprises even numbered columns (Set 0) and said second array comprises odd numbered columns (Set 1).

7. In a computer system including a central processing unit (CPU) coupled to a memory, a method for reading data in said memory comprising the steps of:

providing a first memory array having a plurality of memory cells for storing digital data, each of said memory cells disposed at the intersection of a first plurality of bit line columns and a first plurality of wordlines;

providing a second memory array having a plurality of memory cells for storing digital data, each of said memory cells disposed at the intersection of a second plurality of bit line columns and a second plurality of wordlines, the first and second plurality of wordlines being correspond to each other;

providing a single wordline address decoder/driver assembly centrally disposed in between said first and second memory arrays and exclusively coupled to each of said first and second memory arrays;

receiving an address signal from said CPU by said single wordline address decoder/driver assembly, and selecting said first or said second array, as well as electrically activating one of said wordlines in said selected array in accordance with said address signal by said single wordline address decoder/driver assembly without electrically activating the corresponding wordline of the unselected array, such that each bit line column intersected by said electrically activated wordline in said selected array electrically discharges to provide the value of the memory cell at the point of intersection with the activated wordline as an output to said CPU, while each bit line column intersected by said unactivated corresponding wordline in said unselected array does not electrically discharge to provide the value at the memory cell at the point of intersection with the unactivated wordline;

receiving said values of said memory cells disposed along said activated wordline by said CPU.

8. The method as defined by claim 7 wherein said memory comprises a cache memory.

9. The method as defined by claim 8 wherein said output of each of said bit line columns intersected by said electrically activated wordline is coupled to a sense amplifier before being received by said CPU.

10. The method as defined by claim 9 wherein said selection of said first or second array is made using predefined bits in said address signal.

* * * * *

UNITED STATES PATENT AND TRADEMARK OFFICE
CERTIFICATE OF CORRECTION

PATENT NO. : 5,555,529
DATED : September 10, 1996
INVENTOR(S) : HOSE, Jr. et al

It is certified that error appears in the above-indentified patent and that said Letters Patent is hereby corrected as shown below:

In the Abstract at [57] in line 2 delete "having" and insert --comprising--

In column 4, at line 54, delete "each of", and
    at line 55, replace "intersection" with "intersections".

In column 4, at line 59, delete "each of", and
    at line 60, replace "intersection" with "intersections".

In column 5, at line 32, delete "each of", and
    at line 33, replace "intersection" with "intersections".

In column 5, at line 36, delete "each of", and
    at line 37 replace "intersection" with "intersections".

UNITED STATES PATENT AND TRADEMARK OFFICE
CERTIFICATE OF CORRECTION

PATENT NO. : 5,555,529
DATED : September 10, 1996
INVENTOR(S) : Hose, Jr. et al.

It is certified that error appears in the above-indentified patent and that said Letters Patent is hereby corrected as shown below:

In column 6, at line 12, delete "each of", and at line 13, replace "intersection" with "intersections".

In column 6 at line 18, delete "each of", and at line 19, replace "intersection" with "intersections".

Signed and Sealed this

Twenty-third Day of September, 1997

Attest:

BRUCE LEHMAN

Attesting Officer

Commissioner of Patents and Trademarks